(12) United States Patent
Katsuki

(10) Patent No.: US 7,692,190 B2
(45) Date of Patent: Apr. 6, 2010

(54) SEMICONDUCTOR DEVICE

(75) Inventor: Nobuyuki Katsuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 534 days.

(21) Appl. No.: 11/433,577

(22) Filed: May 15, 2006

(65) Prior Publication Data

US 2006/0273424 A1 Dec. 7, 2006

(30) Foreign Application Priority Data

May 17, 2005 (JP) .............................. 2005-143860

(51) Int. Cl.
*H01L 29/04* (2006.01)
*H01L 29/10* (2006.01)
*H01L 31/036* (2006.01)

(52) U.S. Cl. ........................ 257/50; 257/211; 257/48; 257/209; 257/E21.347; 257/E23.015; 257/100; 257/665; 257/620; 257/E21.599; 257/E23.001; 438/17; 438/215

(58) Field of Classification Search ................. 257/529, 257/48, 50, 100, 209, 211, 620, 665, E21.347, 257/E21.599, E23.15, E23.001; 438/17, 438/215
See application file for complete search history.

(56) References Cited

U.S. PATENT DOCUMENTS

| 6,861,682 | B2* | 3/2005 | Bang et al. ................. 257/209 |
| 2005/0067669 | A1 | 3/2005 | Hisaka | |
| 2005/0236688 | A1* | 10/2005 | Bang et al. ................. 257/529 |

FOREIGN PATENT DOCUMENTS

| JP | 8-213469 | 8/1996 |
| JP | 11-214389 | 8/1999 |
| JP | 2001-135792 | 5/2001 |

* cited by examiner

*Primary Examiner*—Zandra Smith
*Assistant Examiner*—Telly D Green
(74) *Attorney, Agent, or Firm*—Sughrue Mion, PLLC

(57) ABSTRACT

The semiconductor device has a fuse and a fuse opening created above the fuse. The fuse is divided into a plurality of lines at a crossing portion where the fuse crosses with an edge of the fuse opening. The plurality of divided lines of the fuse 101 are in parallel with each other and in perpendicular to the edge of the fuse opening.

9 Claims, 4 Drawing Sheets

US 7,692,190 B2

SEMICONDUCTOR DEVICE

BACKGROUND OF THE INVENTION

1. Field of the Invention

The present invention generally relates to semiconductor device and, particularly, to semiconductor device having a fuse.

2. Description of Related Art

Recently, semiconductor device which have a fuse for switching functions or electric characteristics and increasing yield by defect remedy have been developed.

FIG. 5 is a plan view which schematically shows a part of the structure of a semiconductor device 10 having a fuse according to a related art. The semiconductor device 10 has a fuse 11 and a fuse opening 12. The fuse 11 is mounted inside a semiconductor chip in order to switch functions or electric characteristics and increase yield by remedying defects. The fuse 11 is electrically blown due to heating by laser application, thereby enabling the switching of circuits.

FIG. 6 is a cross-sectional view along line VI-VI of FIG. 5. The semiconductor device 10 has the fuse 11, the fuse opening 12, a semiconductor substrate 14, an interlayer insulating film 15 and an interlayer insulating film 16. The fuse 11 is formed on the lower-layer interlayer insulation film 15 which is deposited on the semiconductor substrate 14. On the fuse 11 is the second-layer interlayer insulating film 16 which is deposited so as to cover the fuse 11. Further, in order to blow the fuse 11 by laser application, the fuse opening 12 is created above the cutout portion of the fuse 11, so that the thickness of the interlayer insulating film 16 is small in that area. FIG. 7 is a circuit diagram which shows a part of the semiconductor device 10 having the fuse illustrated in FIG. 5. As shown in FIG. 7, the fuse 11 is electrically connected to a fuse determination circuit 17 through one pathway.

The multilayer structure on the recent semiconductor device 10 causes an increase in variations in the remaining film of the interlayer insulating film 16 under the fuse opening 12 above the fuse 11. If the interlayer insulating film 16 above the fuse 11 is too thin, the fuse 11 and the interlayer insulating films 15 and 16 are subject to breakdown due to electrical damages such as electrostatic discharge during manufacturing process and package assembly process, which degrades the reliability of the semiconductor device 10. In order to overcome the above drawbacks, various techniques have been proposed including those disclosed in Japanese Unexamined Patent Application Publications Nos. 2001-135792, H11-214389, H08-213469, for example.

The electrostatic discharge is likely to occur particularly at a crossing portion 13 where the fuse 11 and an edge of the fuse opening 12 cross each other because of charge concentration. As shown in FIGS. 5 and 7, one fuse 11 which crosses with the edge of the fuse opening 12 is built with a single electrical system. Thus, if electrostatic discharge occurs in this fuse 11, the fuse 11 is electrically blown, which leads to degradation in the reliability of the semiconductor device 10.

On this account, there is a growing demand for the development of a highly reliable semiconductor device with a fuse even when there are variations in a remaining film above the fuse.

SUMMARY OF THE INVENTION

According to one aspect of the present invention, there is provided a semiconductor device which includes a fuse and a fuse opening created above a cutout portion of the fuse, wherein the fuse is divided into a plurality of lines at a crossing portion where the fuse and an edge of the fuse opening cross each other. In this configuration, even if electrostatic discharge occurs on one of the plurality of lines of the fuse at the crossing section between the fuse and the edge of the fuse opening where charges are likely to concentrate, the electrical connection is not substantially affected, thereby improving the reliability of the semiconductor device.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
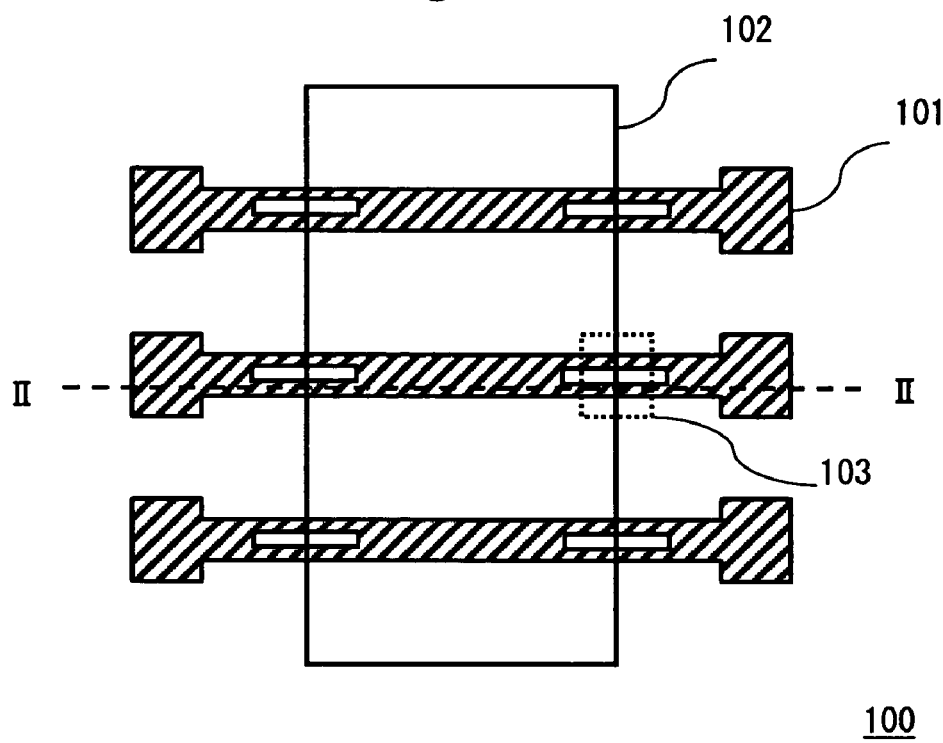
FIG. 1 is a plan view showing a part of the structure of a semiconductor device according to an embodiment of the invention.
Figure 2:
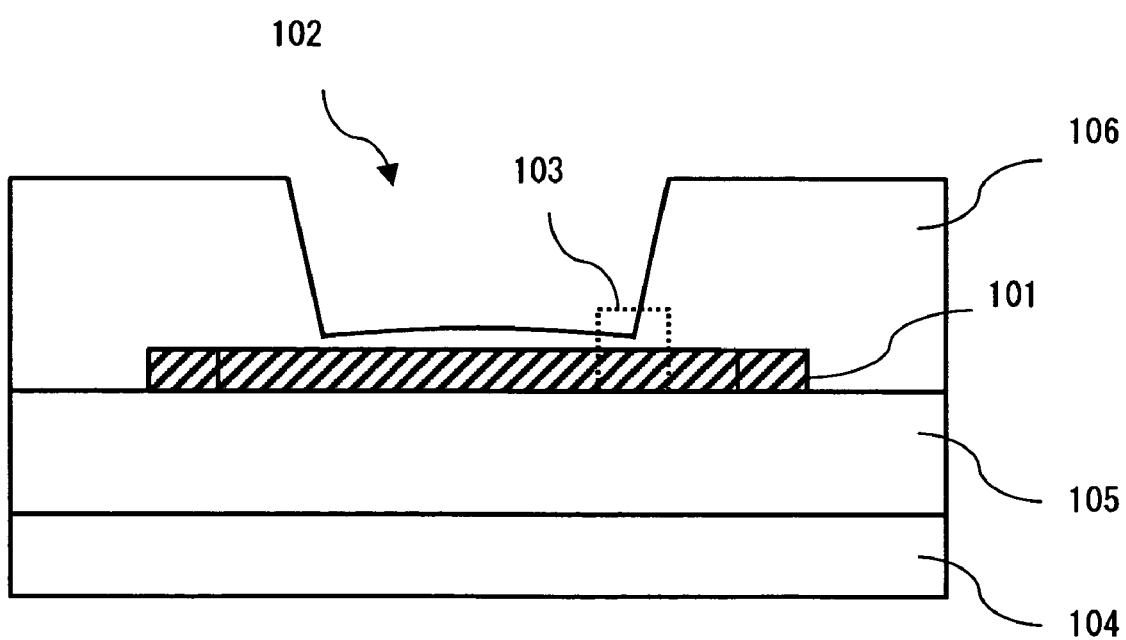
FIG. 2 is a cross-sectional view along line II-II in FIG. 1.

A semiconductor device according to an embodiment of the invention is described hereinafter with reference to FIGS. 1 and 2. FIG. 1 is a plan view showing a part of the structure of the semiconductor device 100 according to this embodiment. FIG. 2 is a cross-sectional view along line II-II in FIG. 1. As shown in FIGS. 1 and 2, the semiconductor device 100 of this embodiment has a fuse 101, a fuse opening 102, a crossing portion 103, a semiconductor substrate 104, an interlayer insulating film 105 and an interlayer insulating film 106. This invention is remarkable in that the fuse 101 is divided into a plurality of lines at the crossing portion 103 between the fuse 101 and the edge of the fuse opening 102. In this embodiment, the fuse 101 is divided into two lines at the crossing portion 103, each pair of lines connected in parallel.

The fuse 101 is mounted inside a semiconductor chip in order to switch functions or electric characteristics and increase yield by defect remedy. The fuse 101 is electrically blown due to heating by laser application, thereby enabling switching of circuits. The fuse opening 102 is created in order to blow the fuse 101 by laser application. Applying laser light through the fuse opening 102 allows the individual blowing of the fuse 101. The area where the fuse 101 and the edge of the fuse opening 102 cross each other is referred to as the crossing portion 103.

As shown in FIG. 2, the fuse 101 is formed on the lower-layer interlayer insulating film 105 which is deposited on the semiconductor substrate 104. On the fuse 101 is the second-layer interlayer insulating film 106 which is deposited so as to cover the fuse 101. Further, in order to blow the fuse 101 by laser application, the fuse opening 102 is created above the cutout portion of the fuse 101, so that the thickness of the interlayer insulating film 106 is small in that area.

The remaining thickness of the interlayer insulating film 106 under the fuse opening 102 is smaller than a prescribed thickness in order to blow the fuse 101 with suitable laser intensity. If, on the other hand, the remaining thickness of the interlayer insulating film 106 is so thin that the fuse 101 is exposed, the corrosion of the fuse 101 can occur to degrade the reliability. Thus, the remaining thickness of the interlayer insulating film 106 under the fuse opening 102 is larger than a prescribed thickness. Therefore, the remaining film of the interlayer insulating film 106 under the fuse opening 102 has an appropriate range of thickness.

The fuse 101 is covered with the interlayer insulating film 106, and charges concentrate on the crossing portion 103 between the fuse 101 and the edge of the fuse opening 102. Therefore, the electrostatic discharge of the fuse 101 and the interlayer insulating film 106 is likely to occur at the crossing portion 103. For example, the dicing process to dice a wafer into semiconductor chips uses water in some cases in order to cool the heat which is generated during cutting and remove silicon chippings which appear during dicing. The charge-up charges which are generated at this time concentrate on the fuse opening 102 where the thickness of the interlayer insulating film 106 is smaller by using water as a medium. Particularly at the crossing portion 103 between the fuse 101 and the edge of the fuse opening 102, the concentration of the charges can cause the blowing of the fuse 101 which needs to be kept connected.

Figure 3:
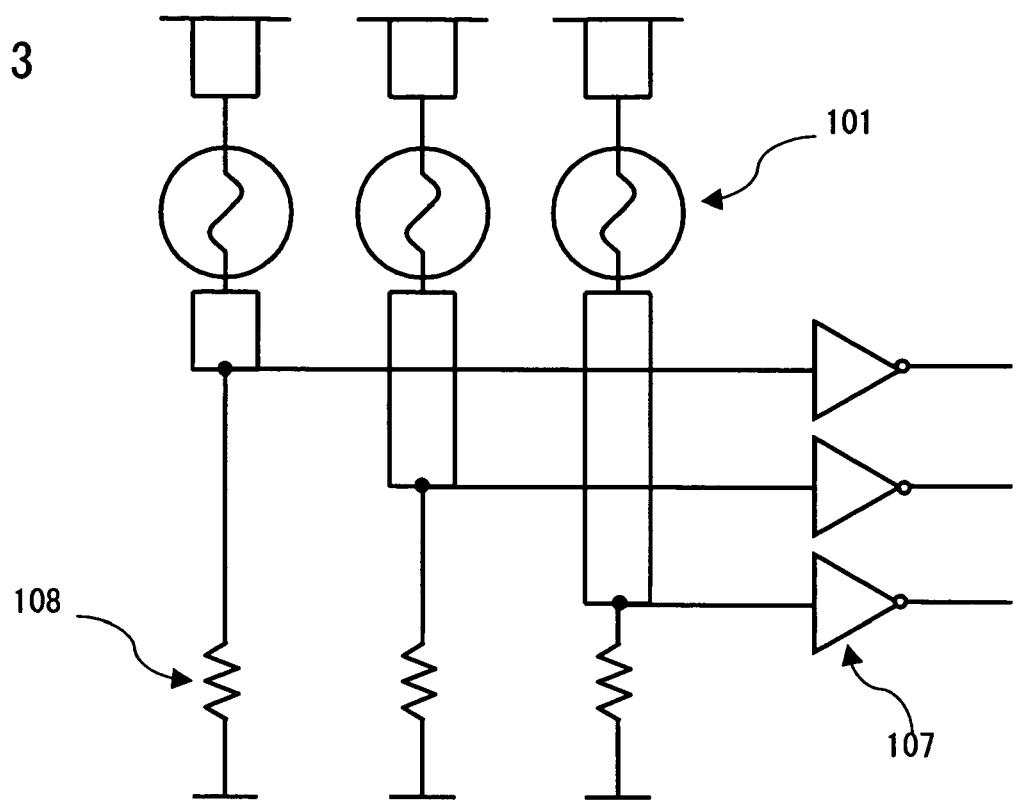
FIG. 3 is a circuit diagram showing a part of the semiconductor device according to an embodiment of the invention.

In this embodiment, one fuse 101 has one slit so that it is divided into two lines arranged in parallel at the crossing portion 103 as shown in FIG. 1. FIG. 3 is a circuit diagram showing a part of the semiconductor device 100 according to this embodiment. One end of each fuse 101 is connected to a power supply through two pathways. The other end of each fuse 101 is connected to an input end of a fuse determination circuit 107 also through two pathways. The connecting point between the other end of each fuse 101 and the fuse determination circuit 107 is connected to one end of a resistor 108. The other end of the resistor 108 is grounded. In this way, each fuse 101 is connected to another device through two pathways. Therefore, even if electrostatic discharge occurs in either one of the two divided pathways at the crossing portion 103 where one fuse 101 and the edge of the fuse opening 102 cross each other, electrical connection can be maintained by the other pathway.

Specifically, the fuse 101 in this embodiment has a first line, two second lines and a third line. The third line connects to the two second lines, and the two second lines connect to the first line. The interlayer insulating film 106 has the fuse opening 102 which exposes the first line and a part of the two second lines. The remaining of the two second lines and the third line are covered with interlayer insulating film 106.

In the related art, one fuse element has one electric pathway. Thus, the occurrence of electrostatic discharge at the crossing portion leads to the blowing of the fuse, thus decreasing the reliability. On the other hand, the present invention divides one fuse 101 into two lines in parallel at the crossing portion 103 so as to secure two electric pathways for one fuse 101. In this configuration, even if electrostatic discharge occurs on one pathway of the fuse 101, the electrical connection can be maintained by the other pathway. It is thereby possible to increase the reliability of the semiconductor device 100.

In the cutout portion of the fuse 101, the fuse 101 is not divided but connected by one electric pathway. It is thereby possible to surely blow the fuse 101 by laser application when switching functions or electric characteristics and so on.

Though the above-described embodiment divides the fuse 101 into two lines at the crossing portion 103, the present invention is not limited thereto. The fuse 101 may be divided into three or more lines in parallel at the crossing portion 103. Specifically, one fuse 101 may have two or more slits at the crossing portion 103. Specifically, the fuse 101 has a first line, three second lines and a third line. The interlayer insulating film 106 has the fuse opening 102 which exposes the first line and a part of the three second lines. The remaining of the three second lines and the third line are covered with interlayer insulating film 106.

Figure 4:
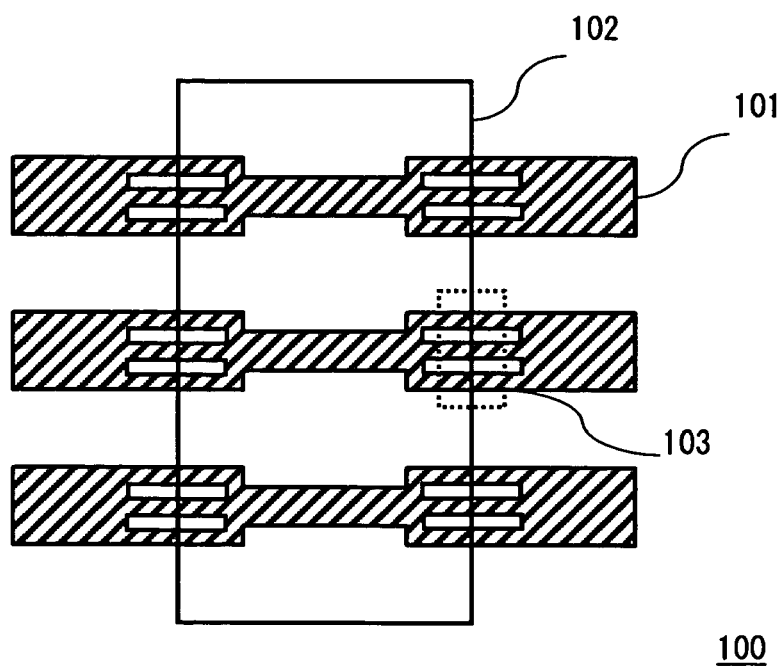
FIG. 4 is a plan view showing a part of another structure of a semiconductor device according to an embodiment of the invention.
Figure 5:
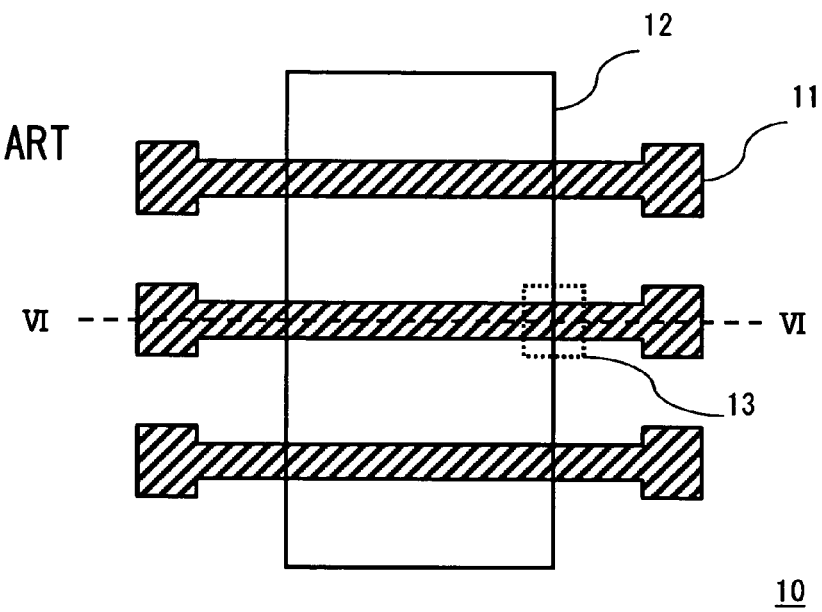
FIG. 5 is a plan view showing a part of the structure of a semiconductor device of a related art.
Figure 6:
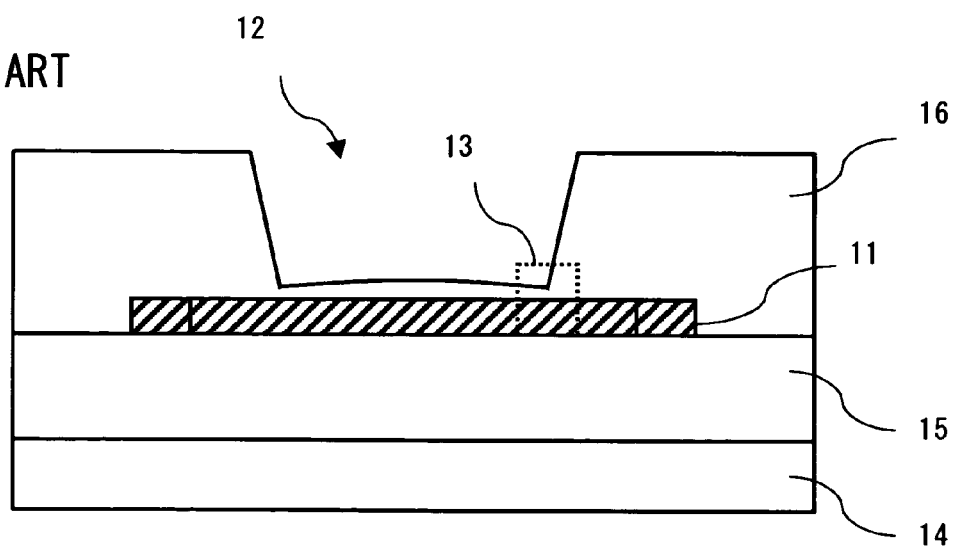
FIG. 6 is a cross-sectional view along line VI-VI in FIG. 5.
Figure 7:
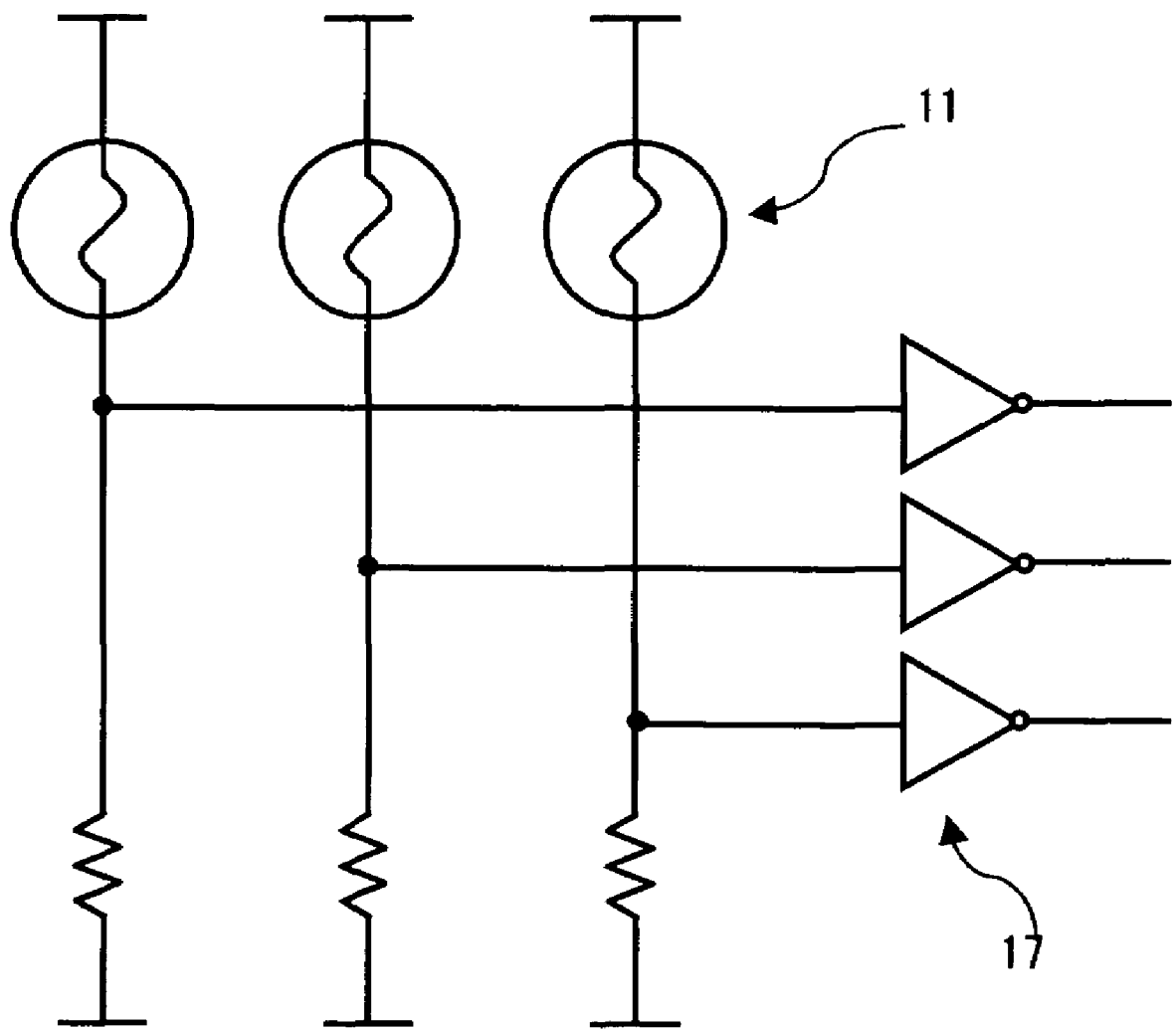
FIG. 7 is a circuit diagram showing a part of a semiconductor device of a related art.

FIG. 4 shows a part of another structure of the semiconductor device 100 according to an embodiment of the invention. The semiconductor device of FIG. 4 is different from that of FIG. 1 in that the fuse 101 is divided into three lines in parallel at the crossing portion 103. In FIG. 4, the same elements as in FIG. 1 are denoted by the same reference numerals and redundant description is omitted.

As shown in FIG. 4, one fuse 101 has two slits at the crossing portion 103 so as to divide the fuse 101 into three lines in parallel at that portion. If the line width of the fuse 101 divided at the crossing portion 103 is too thin, the line resistance becomes too high, which is not suitable for the operation of the semiconductor device 100. To avoid this, the width of the part of the fuse 101 which corresponds to the crossing portion 103 is increased, so that each line of the fuse 101 divided at the crossing portion 103 has a prescribed width. The width of the cutout portion of the fuse 101 remains unchanged, so that the distance between the fuses 101 in the cutout portion is the same as usual.

In this configuration, even if electrostatic discharge occurs on any one of the three pathways of the fuse 101 divided at the crossing portion 103 where the fuse 101 and the edge of the fuse opening 102 cross each other, the electrical connection can be maintained by the other pathways. In addition, this configuration suppresses an increase in line resistance due to a decrease in line width of the fuse 1oldividedatthecrossing-portion103, thereby lowering the adverse effects on the operation of the semiconductor device 100.

Further, dividing the fuse 101 into three or more lines in parallel at the crossing portion 103 in this way allows reducing the probability of occurrence of electrical break in the fuse 101 due to electrostatic discharge. It further allows suppressing the variation in resistance of the fuse 101 upon occurrence of electrostatic discharge. It is thereby possible to provide the more highly reliable semiconductor device 100.

As described in the foregoing, the fuse 101 is divided into a plurality of lines connected in parallel at the crossing portion 103 where the fuse 101 crosses with the edge of the fuse opening 102. It is thereby possible to suppress the degradation of reliability of the semiconductor device 100 due to electrostatic discharge in the fuse 101.

It is apparent that the present invention is not limited to the above embodiment and it may be modified and changed without departing from the scope and spirit of the invention.

What is claimed is:

1. A semiconductor device comprising:
a plurality of fuse lines; and
a layer having a fuse opening above the plurality of fuse lines;

wherein each respective fuse line is sub-divided into a plurality of lines at a crossing portion where each respective fuse line and an edge of the fuse opening cross each other.

2. The semiconductor device according to claim 1, wherein each respective fuse line is divided into three or more lines.

3. A semiconductor device comprising:

a fuse; and a layer having a fuse opening above the fuse;

wherein the fuse has a slit at a crossing portion where the fuse and an edge of the fuse opening cross each other.

4. The semiconductor device according to claim 3, wherein the fuse has two or more slits.

5. A semiconductor device comprising:

a plurality of fuse lines, each respective fuse line having a first line portion and second line portions which are divided from the first line portion; and a layer having an opening to cut the plurality of fuse lines exposing the first line portion and a part of the second line portions of each respective fuse line.

6. The semiconductor device according to claim 5, wherein each respective fuse line further has a third line portion which connects to the second line portions.

7. The semiconductor device according to claim 5, wherein the remaining of second line portions and the third line portion are covered with the layer.

8. The semiconductor device according to claim 1, wherein the plurality of lines of each respective fuse line extend along a same plane.

9. The semiconductor device according to claim 5, wherein the first line portion and the second line portions form one continuous layer, such that the first line portion and the second line portions extend along a same plane.

* * * * *